United States Patent [19]

Yamakoshi et al.

[11] Patent Number: 4,801,892

[45] Date of Patent: Jan. 31, 1989

[54] CURRENT MIRROR CIRCUIT

[75] Inventors: Akira Yamakoshi; Toyohiko Fujita; Kunihiko Tsukakoshi; Shinji Anraku, all of Tokyo, Japan

[73] Assignee: Seikosha Co., Ltd., Tokyo, Japan

[21] Appl. No.: 94,375

[22] Filed: Sep. 9, 1987

[30] Foreign Application Priority Data

Sep. 11, 1986 [JP] Japan ............................. 61-214337

[51] Int. Cl.[4] ............................................ H03F 3/04

[52] U.S. Cl. .................................. 330/288; 323/315

[58] Field of Search ................ 330/257, 288; 323/315, 323/316

[56] References Cited

U.S. PATENT DOCUMENTS 3,936,725 2/1976 Schneider ...................... 330/288 X

*Primary Examiner*—James B. Mullins

*Attorney, Agent, or Firm*—Bruce L. Adams; Van C. Wilks

[57] ABSTRACT

A current mirror circuit of the present invention has the structure that the diode-connected second transistor is connected in series to the first transistor, the third and fourth transistors have bases which are respectively connected to the bases of the first and second transistors which are connected in series, and the collector of the fifth transitors, whose emitter and base are connected between the base and collector of the first transistor, is connected to the collector of the fourth transistor.

5 Claims, 1 Drawing Sheet

CURRENT MIRROR CIRCUIT

FIELD OF THE INVENTION

The present invention relates to a current Miller circuit.

BACKGROUND OF THE INVENTION

A current mirror circuit used generally has the structure indicated in FIG. 2. A current flows as indicated in the figure by connecting a current source I to the diode-connected transistor $T_6$. Namely, when a base current of the transistors $T_6$, $T_7$ is considered as $I_B$, a current $(I-2I_B)$ flows into the transistors $T_6$ and $T_7$.

The circuit explained above has a disadvantage that a current in the mirror side is lowered by $2I_B$.

In addition, a collector current of transistor $T_7$ is varied due to current modulation by the Early effect depending on a collector potential of the mirror side.

SUMMARY OF THE INVENTION

It is an object of the present invention to lower the reduction of current in the mirror side and suppress the influence by the Early effect.

DETAILED DESCRIPTION OF THE INVENTION

Figure 1:
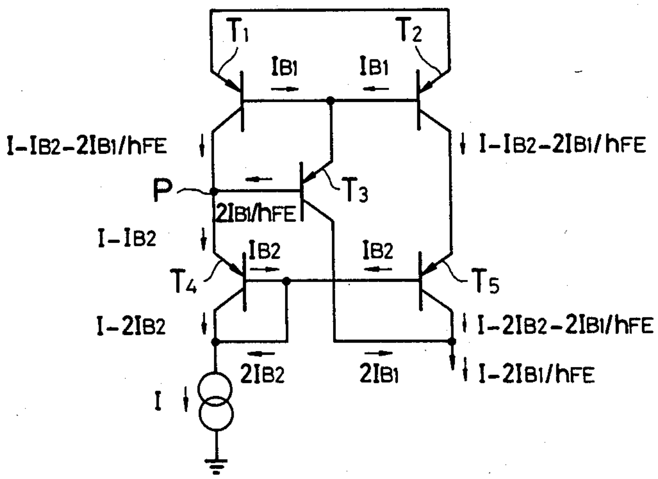
FIG. 1 is an electric circuit indicating an embodiment of the present invention.
Figure 2:
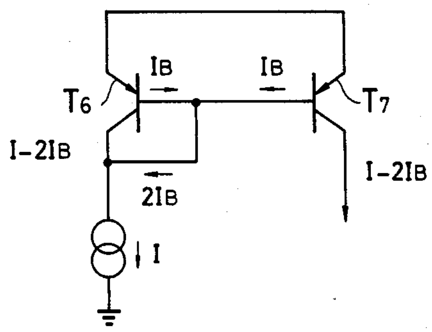
FIG. 2 PRIOR ART
FIG. 2 is an electric circuit indicating an example of a current mirror circuit of the prior art.

In FIG. 1, a diode-connected second transistor $T_4$ is connected in series to the first transistor $T_1$ and the bases of the third and fourth transistors $T_2$, $T_5$ are respectively connected to the bases of the transistors $T_1$, $T_4$. Moreover, the emitter and base of the fifth transistor $T_3$ are respectively connected to the base and collector of transistor $T_1$ and the collector is connected to the collector of transistor $T_5$.

In the above structure, when a current source I is connected, a collector current $I_{CT4}$ of transistor $T_4$ can be expressed as follow, $$I_{CT4}=I-2I_{B2}$$

and an emitter current $I_{ET4}$ is expressed as follows with relation to base current $I_{B2}$.

$$I_{ET4}=I-I_{B2}$$

In this case, a collector current $I_{CT1}$ of transistor $T_1$ is reduced only by the base curent $2I_{B1}/h_{FE}$ of transistor $T_3$ and can be expressed as follows.

$$I_{CT1}=I-I_{B2}-2I_{B1}/h_{FE}$$

Since a collector current $I_{CT2}$ of transistor $T_2$ becomes equal to that of transistor $T_1$, $$I_{CT2}=I_{CT1}$$

A collector current $I_{CT5}$ of transistor $T_5$ is lowered by $I_{B2}$ from the above value and can be expressed as follows.

$$I_{CT5}=I-2I_{B2}-2I_{B1}/h_{FE}$$

Since the collector current $2I_{B1}$ of the transistor $T_3$ is finally added to the collector current of transistor $T_5$, $$I_{CT5}+I_{CT3}=I-2I_{B2}-2I_{B1}/h_{FE}+2I_{B1}$$

Here, when $I_{B1}=I_{B2}=I_B$, $$I_{CT5}+I_{CT3}=I-2I_b/h_{FE}$$

and the influence of $I_B$ on the Miller side becomes $1/h_{FE}$ in comparison with that of the circuit of the prior art.

Since the collector voltage of transistor $T_2$ is set to the same voltage as that of terminal P, namely $2V_{BE}$ when the base-emitter voltage of transistors $T_1 \sim T_3$ is set to $V_{BE}$ by cascade-connecting the transistor $T_5$, the influence of the Early effect can also be suppressed.

According to the present invention, reduction of current in the mirror current side can be set to $1/h_{FE}$ and the Early effect of the transistor in the mirror current output side can also be supressed, and thereby the current mirror circuit just suited to integration can be obtained.

What is claimed is:

1. A current mirror circuit comprising a first transistor, a second diode-connected transistor connected in series to said first transistor and having a collector receptive of an input current, a third transistor having a base which is connected to a base of said first transistor, a fourth transistor connected in series to the third transistor with a base connected to a base of said second transistor and a collector from which an output current is obtained, and a fifth transistor having an emitter which is connected to the base of said first transistor a base connected to a collector of said first transistor and a collector directly connected to the collector of said fourth transistor.

2. A current mirror circuit comprising a first transistor, a diode-connected second transistor connected in series to said first transistor, a third transistor having a base which is connected to a base of said first transistor, a fourth transistor connected in series to the third transistor with a base connected to a base of said second transistor, and a fifth transistor having an emitter which is connected to the base of said first transistor, a base connected to a collector of said first transistor and a collector directly connected to a collector of said fourth transistor, an output for an output signal current $I-2I_B/h_{FE}$ at the collector of the fifth transistor, an input for an input signal current I to a collector of said second transistor, wherein $I_B$ is the base current of said first and third transistors and $h_{FE}$ is the grounded emitter current amplification of the first, second, third, fourth and fifth transistors.

3. A current circuit comprising:

a first transistor having an emitter, a base and a collector;

a second transistor having an emitter connected to the collector of the first transistor, a collector and a base connected together, wherein the collector is receptive of an input current applied thereto;

a third transistor having a base connected to the base of the first transistor, an emitter connected to the emitter of the first transistor and a collector;

a fourth transistor having an emitter connected to the collector of the third transistor, a base connected to the base of the second transistor and a collector from which an output is obtained; and a fifth transistor having an emitter connected to the base of the first transistor, a base connected to the collector of the first transistor and a collector directly connected to the collector of the fourth transistor.

4. The circuit according to claim 3, wherein all of the transistors have the same polarity.

5. The circuit according to claim 3, wherein the transistors are of the pnp type.

* * * * *